(12) United States Patent
Tierno et al.

(10) Patent No.: US 12,021,538 B2
(45) Date of Patent: Jun. 25, 2024

(54) CLOCK FREQUENCY LIMITER

(71) Applicant: Apple Inc., Cupertino, CA (US)

(72) Inventors: Jose A. Tierno, Menlo Park, CA (US); Ajay M. Rao, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/664,364

(22) Filed: May 20, 2022

(65) Prior Publication Data
US 2023/0378962 A1 Nov. 23, 2023

(51) Int. Cl.
*H03L 7/083* (2006.01)
*H03L 7/085* (2006.01)
*H03L 7/099* (2006.01)

(52) U.S. Cl.
CPC .............. *H03L 7/083* (2013.01); *H03L 7/085* (2013.01); *H03L 7/0991* (2013.01)

(58) Field of Classification Search
CPC ........ H03L 7/083; H03L 7/085; H03L 7/0991
See application file for complete search history.

(56) References Cited

U.S. PATENT DOCUMENTS

| | | | |
|---|---|---|---|
| 6,307,411 B1 | 10/2001 | Kerner | |
| 8,284,888 B2 | 10/2012 | Kyles | |
| 9,397,868 B1 | 7/2016 | Hossain et al. | |
| 9,455,854 B2 * | 9/2016 | Gao | H04B 17/21 |
| 9,735,904 B2 | 8/2017 | Kuo et al. | |
| 9,838,025 B1 | 12/2017 | Deng et al. | |
| 9,935,640 B1 * | 4/2018 | Chan | H03C 3/0991 |
| 9,954,543 B1 * | 4/2018 | Chan | H03L 7/099 |
| 10,164,806 B2 | 12/2018 | Jang | |
| 10,498,469 B2 | 12/2019 | Cohen et al. | |
| 10,693,472 B2 * | 6/2020 | Kim | H03L 7/089 |
| 10,763,865 B1 * | 9/2020 | Badizadegan | G06F 13/4291 |
| 10,826,502 B1 * | 11/2020 | Badizadegan | G06F 30/34 |
| 10,862,427 B1 * | 12/2020 | Chan | H03C 3/0966 |
| 10,965,438 B1 * | 3/2021 | Sun | H04L 25/03057 |
| 11,329,656 B2 * | 5/2022 | Farian | H03L 7/099 |
| 11,469,877 B1 * | 10/2022 | Raj | H04L 25/4917 |
| 11,641,207 B2 * | 5/2023 | Xu | H03L 7/093 327/157 |
| 11,700,005 B2 * | 7/2023 | Choo | H03L 7/0995 327/157 |
| 2003/0058052 A1 | 3/2003 | Birk et al. | |

(Continued)

OTHER PUBLICATIONS

International Search Report and Written Opinion in PCT Appl. No. PCT/US2023/021475 mailed Aug. 24, 2023, 11 pages.

*Primary Examiner* — Adam D Houston
(74) *Attorney, Agent, or Firm* — Kowert, Hood, Munyon, Rankin & Goetzel, P.C.; Gentry C. McLean; Dean M. Munyon

(57) ABSTRACT

A receiver circuit that limits the frequency of a clock signal used in a computer system is disclosed. An embodiment of the receiver circuit includes a front-end circuit that generates an equalized signal, a clock generator circuit that generates a clock signal using a plurality of samples of the equalized signal, and a measurement circuit. The measurement circuit monitors a frequency of the clock signal and generates an indication signal in response to determining that the frequency of the clock signal exceeds a threshold frequency. The clock generator circuit uses the indication signal to adjust a frequency of the clock signal.

20 Claims, 10 Drawing Sheets

(56) References Cited

U.S. PATENT DOCUMENTS

| | | | |
|---|---|---|---|
| 2006/0145776 A1* | 7/2006 | Shi | H03L 7/18 |
| | | | 331/175 |
| 2018/0183567 A1* | 6/2018 | Yoo | H03L 7/093 |
| 2019/0116069 A1* | 4/2019 | Chen | H04L 25/03019 |
| 2021/0257033 A1* | 8/2021 | Wu | H04L 7/0337 |
| 2022/0302918 A1* | 9/2022 | Srivastava | G06F 1/08 |

* cited by examiner

600

```
┌─────────────────────────────────────────────┐
│ Receiving at least one signal via a          │
│ communication link, wherein the at least one │
│ signal encodes a serial data stream that     │
│ includes a plurality of data symbols         │
│ 602                                          │
└─────────────────────────────────────────────┘
                      ↓
┌─────────────────────────────────────────────┐
│ Sampling the at least one signal at multiple │
│ points in time to generate a plurality of    │
│ samples                                      │
│ 604                                          │
└─────────────────────────────────────────────┘
                      ↓
┌─────────────────────────────────────────────┐
│ Generating a clock signal using the          │
│ plurality of samples                         │
│ 606                                          │
└─────────────────────────────────────────────┘
                      ↓
┌─────────────────────────────────────────────┐
│ Monitoring a frequency of the clock signal   │
│ 608                                          │
└─────────────────────────────────────────────┘
                      ↓
┌─────────────────────────────────────────────┐
│ In response to determining that the          │
│ frequency of the clock signal exceeds a      │
│ threshold frequency, adjusting the frequency │
│ of the clock signal                          │
│ 610                                          │
└─────────────────────────────────────────────┘
```

CLOCK FREQUENCY LIMITER

BACKGROUND

Technical Field

Embodiments described herein relate to communication data links for integrated circuits, and more particularly, to techniques for limiting the frequency increase of a clock generated by a receiver circuit.

Description of the Related Art

Modern computer systems may include multiple circuit blocks designed to perform various functions. For example, such circuit blocks may include processors and/or processor cores configured to execute software or program instructions. Additionally, the circuit blocks may include memory circuits, mixed-signal or analog circuits, and the like. Circuit blocks may also include transmitter and receiver circuits for communicating data between the computer system and external devices or other computer systems. Data can be communicated using multiple different protocols and formats. As an example, serial data can be transmitted and received via a Universal Serial Bus (USB) connection.

Circuit blocks within a computer system use clock signals to control timing of their operations. Clock generation circuits may be included in a computer system to generate clock signals used by circuit blocks throughout the system. Some receiver circuits generate a clock signal by recovering clock information from an incoming serial data stream. In some cases such a clock recovery circuit generates a clock signal by recovering clock information embedded in the incoming data stream. A clock recovery circuit can also generate a clock signal which it then aligns to transitions in a data stream without embedded clock information, in a process called clock and data recovery (CDR). This disclosure is concerned with such CDR circuits.

BRIEF DESCRIPTION OF THE DRAWINGS

The following detailed description makes reference to the accompanying drawings, which are now briefly described.

FIG. 6 is a flow diagram illustrating an embodiment of a method for operating a device including a receiver circuit.

DETAILED DESCRIPTION OF EMBODIMENTS

Figure 1:
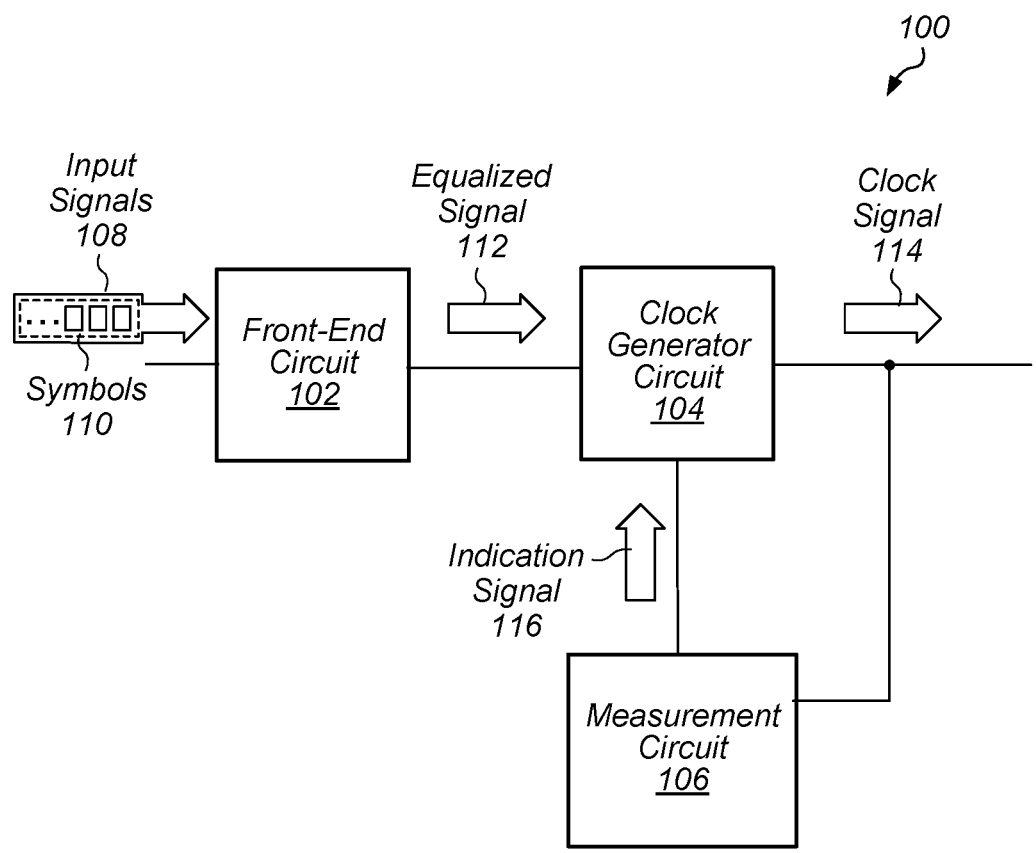
FIG. 1 is a block diagram of an embodiment of a receiver circuit.

Operation of computer systems requires transfer of data between integrated circuits. Such chip-to-chip communication may be between circuits in separate devices or systems, or between circuits within the same device or system. Communication links may be parallel links, in which multiple channels send parts of the data simultaneously. As an example, an eight-bit word may be transferred using eight parallel lines carrying one bit each. Additional lines or channels in a parallel communications link may carry other information such as a clock signal or control signals. Parallel communication links can transmit data quickly, but the multiple data channels increase power consumption, add expense, and take up scarce space on integrated circuits or circuit boards within a device or system. Parallel data channels can also experience crosstalk interference with one another or distortion affecting the separate channels differently, especially over longer distances.

Because of limitations with parallel communication links such as those noted above, serial communication links are often used instead. A serial communication link sends data over a single channel as a series of symbols, where each symbol corresponds to one or more bits of data. The data is serialized and encoded into symbols for transmission, then decoded and deserialized once received. Because a serial communication link does not include a separate channel for a clock signal, a clock signal is "recovered" from the serial data stream itself by the receiver to sample the signal(s) received over the serial communication link. A popular type of clock recovery circuit uses a phase-locked loop (PLL) circuit to align transitions in the output of an oscillator circuit with transitions in a serial data stream and produce a local clock signal that can be used by receiver-side circuitry.

A sudden interruption of data flow to a PLL-based clock recovery circuit, such as by unplugging a Universal Serial Bus (USB) connection, removes the data transitions leaving only noise for the PLL circuit to use for alignment. This can cause the frequency of the output of the PLL circuit's oscillator circuit to increase significantly as a phase detector within the PLL circuit shifts the oscillator circuit's frequency in an attempt to locate transitions in the noise. The increase in the oscillator circuit's frequency can cause the local clock signal to exceed an operating frequency limit of the circuitry using the clock signal. If the clock signal is allowed to exceed the operating frequency, logical state in the circuitry can be lost and error introduced due to setup and/or hold time failures, and the like. In some circuits, the frequency increase caused by data interruption can cause loss of state in associated circuitry to occur very rapidly. For example, in some cases loss of state can occur within approximately 0.5 microseconds after the loss of incoming data. Approaches involving use of the PLL operation to counteract this frequency increase may be too slow to avoid loss of logical state, because of the time needed for the PLL circuit to converge.

Techniques described in the present disclosure allow rapid determination of the frequency of a local clock signal and comparison of the frequency to a threshold value. If an increase in frequency beyond the threshold is detected, the clock frequency is adjusted. This solution may allow the clock frequency to be maintained below a level at which circuit blocks using the clock signal could experience loss of logical state. Detection of a clock signal frequency at or above the threshold value can serve as an indication that the incoming data stream has been disconnected, and an orderly shutdown of circuit blocks using the local clock signal can be initiated.

A block diagram depicting an embodiment of a receiver circuit is shown in FIG. 1. As illustrated, receiver circuit 100 includes front-end circuit 102, clock generator circuit 104, and measurement circuit 106.

Front-end circuit 102 is configured to receive a set of signals 108 that encodes a serial data stream including a plurality of symbols 110. A symbol as used herein is a state of a communications channel, such as an amplitude, phase or frequency of a waveform, that is used to transfer one or more bits of data. Circuit 102 performs an equalization process to restore balance between frequency components of signals 108 and correct for signal degradation or distortion resulting from phenomena such as reflections along a communications link or channel. In an embodiment, circuit 102 performs continuous-time linear equalization (CTLE). An equalized signal 112, which may be a set of multiple signals, is produced by front-end circuit 102.

Clock generator circuit 104 is configured to generate clock signal 114 using equalized signal 112. As discussed further herein in connection with FIG. 2, clock generator circuit 104 samples equalized signal 112 to locate transitions in signal 112 so that transitions of a clock generated using a voltage-controlled oscillator (VCO) can be phase-aligned to the transitions in signal 112. Resulting clock signal 114 is provided to additional circuit blocks, such as circuit blocks used for processing data recovered from equalized signal 112. In an embodiment, clock generator circuit 104 is a clock and data recovery (CDR) circuit producing a recovered data signal (not shown in FIG. 1) in addition to clock signal 114.

Because clock generator circuit 104 operates by aligning transitions of clock signal 114 with transitions of equalized signal 112, errors can arise when the input data stream encoded by input signals 108 is interrupted. This could happen as a result of unplugging a USB connection, for example. If the incoming data signal is lost, clock generator circuit 104 attempts to align transitions of clock signal 114 to transitions in an incoming signal that is only a noise signal. This can lead to a rapid increase in the frequency of clock signal 114, or a "runaway" condition. When the frequency of clock signal 114 increases beyond a threshold frequency associated with the timing requirements of the circuit blocks using clock signal 114 for processing, signal errors and loss of state in those circuit blocks can result.

Measurement circuit 106 is used in addressing the problem of clock frequency runaway when incoming data is interrupted. Measurement circuit 106 is configured to monitor the frequency of clock signal 114, and in response to a determination that the frequency of the clock signal 114 exceeds a threshold frequency, generate indication signal 116 and send it to clock generator circuit 104. Clock generator circuit 104 is configured to adjust the frequency of clock signal 114 using indication signal 116. Receiver circuit 100 therefore has the potential to stop an increase in frequency of clock signal 114 in response to a loss of input data before the frequency increases enough to cause a loss of state in circuit blocks using clock signal 114.

Figure 2:
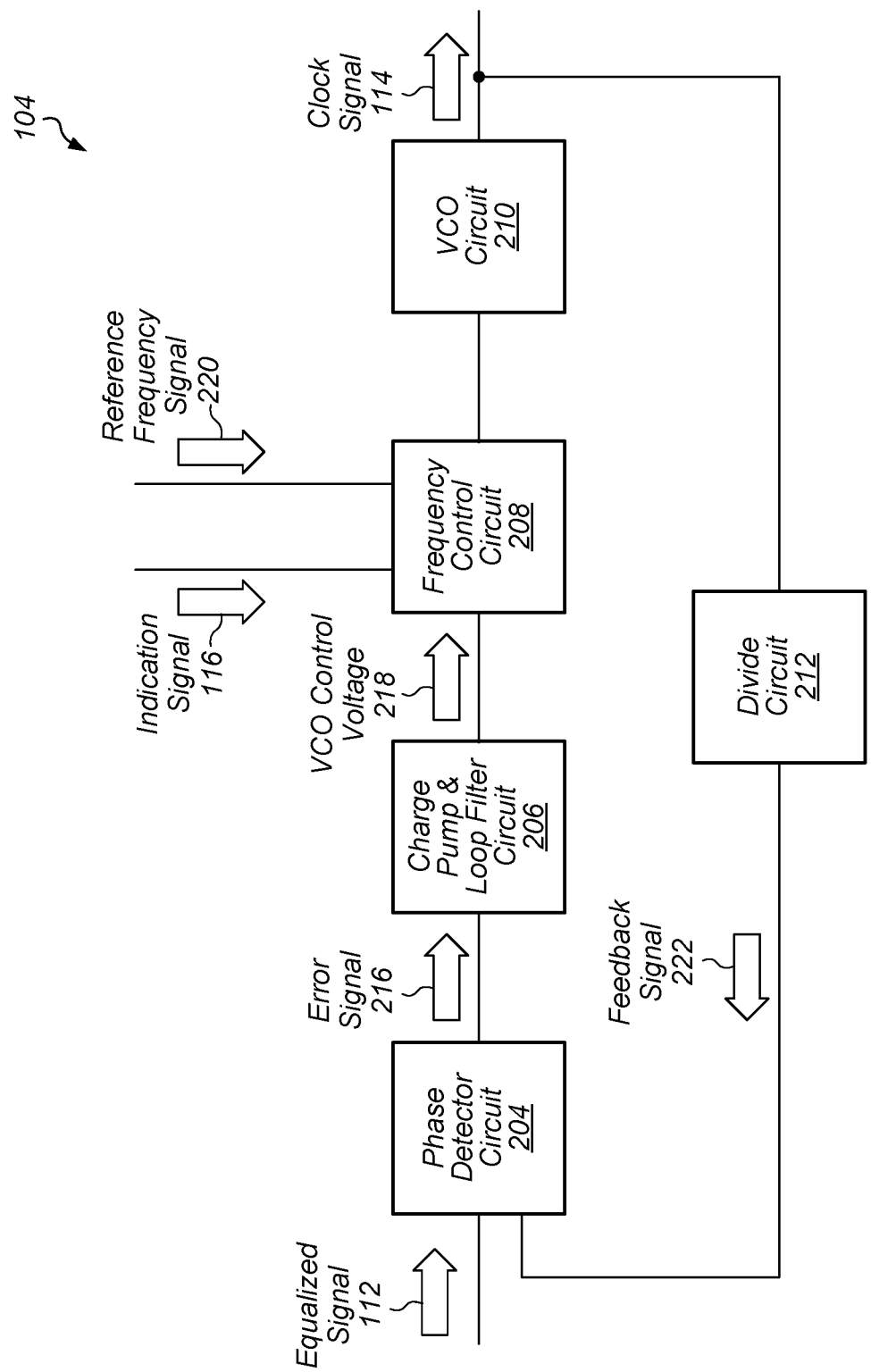
FIG. 2 is a block diagram of an embodiment of a clock generator circuit

Turning to FIG. 2, a block diagram of an embodiment of clock generator circuit 104 is shown. As illustrated, clock generator circuit 104 includes phase detector circuit 204, charge pump and loop filter circuit 206, frequency control circuit 208, VCO circuit 210, and divide circuit 212.

Phase detector circuit 204 is configured to sample equalized signal 112 using a clock signal. In the embodiment of FIG. 2, phase detector circuit 204 samples equalized signal 112 using feedback signal 222, which is a frequency-divided version of clock signal 114 produced by VCO circuit 210. Equalized signal 112 is sampled using multiple transitions of feedback signal 222 occurring at different points in time, resulting in multiple samples. In an embodiment, comparisons between samples are used to determine whether transitions of the clock are "early" or "late" as compared to transitions of the incoming data in equalized signal 112. Error signal 216 includes pulses characterizing an error in alignment between signals 222 and 112, such as pulses indicating whether the clock is running early or late compared to the data. In an embodiment, phase detector circuit 204 includes a bang-bang phase detector such as an Alexander phase detector. Other types of phase detector may be used in other embodiments. In an embodiment, phase detector circuit 204 uses samples of equalized signal 112 to produce a recovered data signal (not shown in FIG. 2) in addition to error signal 216.

Charge pump and loop filter circuit 206 are configured to convert error signal 216 to an analog VCO control voltage 218. In an embodiment, the loop filter includes a capacitor connected between the output node of charge pump and loop filter circuit 206 and ground, so that VCO control voltage 218 appears across the capacitor. In such an embodiment, the charge pump may include a first current source connected, via a first switch controlled by error signal 216, between supply voltage and the output node of charge pump and loop filter circuit 206, and a second current source connected, via a second switch controlled by error signal 216, between the output node of the charge pump and loop filter circuit and ground. Depending on whether error signal 216 indicates that transitions of feedback signal 222 are early or late compared to transitions of equalized signal 112, the charge pump switches are set to either add charge to the loop filter capacitor or drain some of the capacitor's charge to ground. This charge flow will adjust the value of VCO control voltage 218.

VCO circuit 210 is an oscillator circuit having a frequency controlled by voltage 218. In an embodiment, VCO circuit 210 includes an LC oscillator having its resonant frequency adjusted using VCO control voltage 218. For example, VCO control voltage 218 may be applied to a control input of a transistor or other switch element setting a bias current for an LC oscillator circuit. VCO circuit 210 may, in other embodiments, be implemented with other types of oscillator circuits, such as a ring oscillator circuit in which VCO control voltage 218 is used to adjust a bias current, and, therefore, propagation speed, of the ring oscillator stages. Depending on the frequency range of VCO circuit 210 and the frequency of equalized signal 112, divide circuit 212 may divide the frequency of clock signal 114 by any number, including by 1, or may be absent in some embodiments. In an embodiment, divide circuit 212 is configured to provide integer division, fractional division or a combination of these, implemented using one or more flip-flops, counters or other combinational or sequential logic circuits. Level shifting or scaling circuitry to increase the voltage swing of the clock signal produced by VCO circuit 210 may also be included within or following VCO circuit 210 in some embodiments. A divide circuit may also be included within or following VCO circuit 210, such that clock signal 114 is a divided version of the VCO output in some embodiments.

During operation of clock generator circuit 104 with incoming data present in equalized signal 112, error signal 216, as converted to VCO control voltage 218, causes a change in the frequency of clock signal 114 produced by VCO circuit 210. This changes the frequency of feedback signal 222, which is used by phase detector circuit 204 to continue sampling equalized signal 112 to determine whether the transitions of signal 222 are aligned to transitions in signal 112. As the process continues, the PLL implemented by phase detector circuit 204, charge pump and loop filter circuit 206, VCO circuit 210 and divide circuit 212 will "lock" such that feedback signal 222, and, therefore, also clock signal 114, is phase-aligned to the incoming data.

When incoming data in equalized signal 112 suddenly disappears, however, phase detector circuit 204 does not have data transitions to attempt to align transitions in feedback signal 222 to. Instead, samples taken by phase detector circuit 204 are sampling only noise on the incoming signal line. In an embodiment, phase detector circuit 204 responds to the loss of data by indicating via error signal 216 that transitions of feedback 222 are too late to align with transitions in the data signal. This causes control voltage 218 to effect an increase in clock signal 114 produced by VCO circuit 210. In the absence of incoming data, residual frequency offsets in phase detector circuit 204 may drive the detector's behavior in some embodiments.

Continued indications by phase detector circuit 204 that the clock transitions are too late can result in a rapid increase in frequency of clock signal 114, which can exceed timing limits of circuit blocks making use of clock signal 114 (or a divided version of it). This "frequency runaway" effect can be particularly strong for single-loop clock generator circuit architectures in which the output clock signal is produced directly from the VCO, as shown in FIG. 2. Other architectures in which the output clock signal is produced using an additional loop (for example, by a phase interpolator circuit mixing different phases of the clock signal produced by the VCO) can be more constrained in the amount of frequency drift they exhibit, but these architectures may have disadvantages in other areas such as effective bandwidth of a CDR circuit and complexity of implementation. Frequency control circuit 208 helps to limit the clock signal frequency increase caused by data interruption.

Frequency control circuit 208 is configured to adjust the frequency of clock signal 114 in response to receiving indication signal 116. In the embodiment of FIG. 2, control circuit 208 is interposed between charge pump and loop filter circuit 206 and VCO circuit 210. If indication signal 116 is absent or in an "off" state, control circuit 208 passes VCO control voltage 218 to VCO circuit 210 resulting in normal PLL operation. When indication signal 116 is present or in an "on" state, however, control circuit 208 breaks the connection between charge pump and filter circuit 206 and VCO circuit 210, providing an alternate control signal to VCO circuit 210. In an embodiment, reference frequency signal 220 is in the form of a control voltage designed to set VCO 210 to a particular output frequency for clock signal 114. In such an embodiment, frequency control circuit 208 can be implemented in the form of a switch connecting a voltage control input of VCO circuit 210 to either VCO control voltage 218 or reference frequency signal 220, where the switch is controlled using indication signal 116. Such a switch may be implemented as a pass gate, single metal-oxide semiconductor field-effect transistor (MOSFET), Fin field-effect transistor (FinFET), gate-all-around field-effect transistor (GAAFET) or any other suitable switching device or element.

It is noted that the clock generator circuit of FIG. 2 is merely an example implementation of a clock generator circuit as disclosed herein. For example, in some embodiments, frequency control circuit 208 may be configured to bypass VCO circuit 210 entirely in response to indication signal 116 by using a multiplex circuit to connect a reference clock signal rather than the output of VCO circuit 210 as clock signal 114. As another example, some or all of the analog elements of the PLL formed using phase detector circuit 204, charge pump and filter circuit 206, VCO circuit 210 and divide circuit 212 could be implemented as digital elements in various embodiments.

Figure 3:
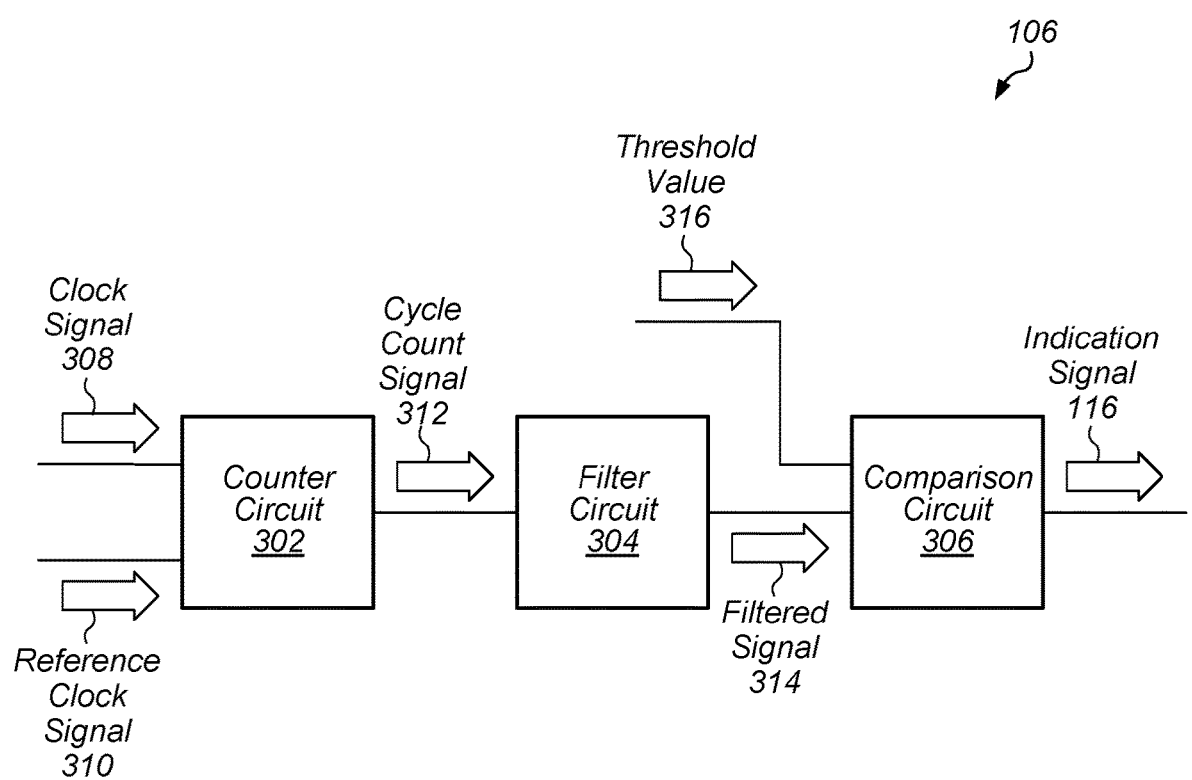
FIG. 3 is a block diagram of an embodiment of a measurement circuit.

FIG. 3 is a block diagram illustrating an embodiment of measurement circuit 106. As illustrated, measurement circuit 106 includes counter circuit 302, filter circuit 304 and comparison circuit 306. In the embodiment of FIG. 3, measurement circuit 106 continually monitors the frequency of an incoming clock signal 308 by counting a number of cycles of the clock signal in one or more periods of a reference clock signal 310. This number is filtered to reduce the effects of noise and compared to a threshold value 316 to detect a degree of frequency increase causing a threshold frequency to be exceeded.

Counter circuit 302 is configured to continually count a number of cycles of clock signal 308 occurring within one or more cycles of a reference clock signal 310. In various embodiments, clock signal 308 may be clock signal 114 produced by clock generator circuit 104, feedback signal 222 delivered to phase detector circuit 204 or a frequency-divided version of either of these. In one embodiment, clock signal 308 is a divided-by-20 version of feedback signal 222. Reference clock signal 310 is an external clock signal having a known frequency lower than that of clock signal 308. In an embodiment, multiple cycles of clock signal 308 occur during one or two periods of reference clock signal 310.

In an embodiment, counter circuit 302 counts the number of cycles of clock signal 308 within one or more periods of reference clock 310 by sampling a continuous counter of cycles of clock signal 308, where the samples are taken one or more reference clock cycles apart. The continuous counter has a width sufficient to allow multiple samples to be obtained before the counter output "wraps around" and starts over. The continuous counter of clock signal 308 cycles can be implemented in various ways that will be understood by one of ordinary skill in the art of digital circuit design in view of this disclosure. For example, the continuous counter may include a sequence of cascaded flip-flops clocked using clock signal 308. The continuous counter may also be implemented using an adder circuit having one input tied to a logical "1" followed by a register clocked using clock signal 308, where the output of the register feeds back to the other input of the adder. Counters, adders, flip-flops, registers and other digital circuits referenced herein can include logical gates formed from switch devices of any suitable technology, including field effect and bipolar transistor technologies, or any other suitable transconductance devices. Any suitable transistor types may be used, including multiple-gate or three-dimensional metal-oxide-semiconductor field-effect transistors (MOSFETs), such as FinFETs or gate-all-around FETs (GAAFETs).

The number of cycles of clock signal 308 occurring during one or more cycles of reference clock 310 may be found by subtracting consecutive samples of the continuous counter taken one or more reference clock cycles apart. In an embodiment, the counter is passed through a register that is clocked with a gated version of clock signal 308 causing the register to output the current counter value only at intervals of one or more periods of reference clock signal 310. A digital subtraction circuit can then be used to find a difference between counter samples using gated and ungated clock signals 308, to obtain a number of cycles of clock signal 308 during the selected number of periods of reference clock signal 310. This output is shown as cycle count signal 312 in FIG. 3. In an embodiment, the difference circuit is clocked using the gated version of clock signal 308.

In an embodiment, a gated version of clock signal 308 is generated using an integrated clock gating (ICG) circuit having an enable signal configured to pass a cycle of clock signal 308 once during the selected number of periods of reference clock signal 310. The enable signal may be generated, for example, by performing an exclusive-or operation between a divided version of reference clock signal 310 and the same signal delayed by one cycle of clock signal 308. In an embodiment, the divided version of reference clock signal 310 is first synchronized to clock signal 308 using a synchronizer circuit clocked by clock signal 308.

The number of cycles of reference clock signal 310 that the counter is run for between samples may be selected based on relative frequencies of clock signal 308 and reference clock signal 310. In general, fewer cycles of clock signal 310 may be used as the sampling interval for higher frequencies of clock signal 308, while more cycles may be used for lower frequencies. In one embodiment, a single cycle of reference clock signal 310 is used as the sampling interval for higher frequencies of clock signal 308, corresponding to higher data rates of the incoming serial data to receiver 100. Use of a single reference clock cycle provides faster operation of measurement circuit 106 so that clock frequency runaway can be more rapidly detected and loss of state in associated circuit blocks may be prevented. For lower frequencies of clock signal 308 two or more cycles of reference clock signal 310 may be used as the sampling interval so that the synchronizer circuit operates properly. In an example embodiment using a reference clock signal 310 having a frequency of about 100 MHz, a single cycle of reference clock signal 310 is used as a sampling interval when clock signal 308 has a frequency in a range from about 400 MHz to 1 GHz, while two cycles of reference clock signal 310 are used as a sampling interval when clock signal 308 has a frequency between 250 MHz and 400 MHz. Frequency measurement by measurement circuit 106 becomes less effective as a frequency of clock signal 308 approaches that of reference clock signal 310.

Filter circuit 304 is configured to digitally filter cycle count signal 312 to produce filtered signal 314. Filter circuit 304 may reduce the effects of noise in cycle count signal 312, such as quantization noise due to sampling in counter circuit 302, thereby improving the accuracy of the determination by measurement circuit 106 that the frequency of clock signal 308 has exceeded a threshold frequency. In an embodiment, filter circuit 304 is configured to provide a high resolution of measurement circuit 106 while having a relatively low latency so that a frequency runaway condition can be detected quickly. As an example, a second-order cascaded integrator-comb (CIC) decimation filter may provide a suitable balance between latency and stop-band characteristics. A decimation ratio of such a filter may be chosen to match a number of cycles of reference clock signal 310 constituting an acceptable latency for the filter. In one embodiment of such a filter, a decimation ratio of 20 is used. Throughput of such a CIC decimation filter may be improved using a parallel set of differential (or "comb") stages in some embodiments, where each parallel stage includes a decimator preceding the two comb elements (for a second order filter) and is clocked by a different phase of the filter's clock. A multiplexer can be used to consecutively select the individual phase outputs to form the output filtered signal. In one embodiment of a CIC decimation filter, four parallel differential stages are used.

In an embodiment, filter circuit 304 is clocked using a clock gated using one or more periods of reference clock signal 310. In a further embodiment, filter circuit 304 is clocked using a gated clock generated by counter circuit 302 in producing cycle count signal 312. In some embodiments, an additional "droop compensation" filter for improving flatness of the filter's frequency response is omitted in filter circuit 304 in order to improve latency of the filter. Use of filtered signal 314 in a threshold comparison by measurement circuit 106 may not require use of any additional compensation filter.

Comparison circuit 306 of FIG. 3 is configured to use filtered signal 314 and a threshold value 316 in determining whether the threshold has been exceeded. In an embodiment, exceeding of threshold 316 is an indication that the frequency of clock signal 308 has exceeded a threshold frequency. If threshold 316 is exceeded, comparison circuit 306 is configured to generate or set to an "on" state (such as a logical high value) indication signal 116. Indication signal 116 is in turn used to adjust the frequency of clock signal 308, as discussed in connection with the description of clock generator circuit 104 of FIG. 2.

Figure 4:
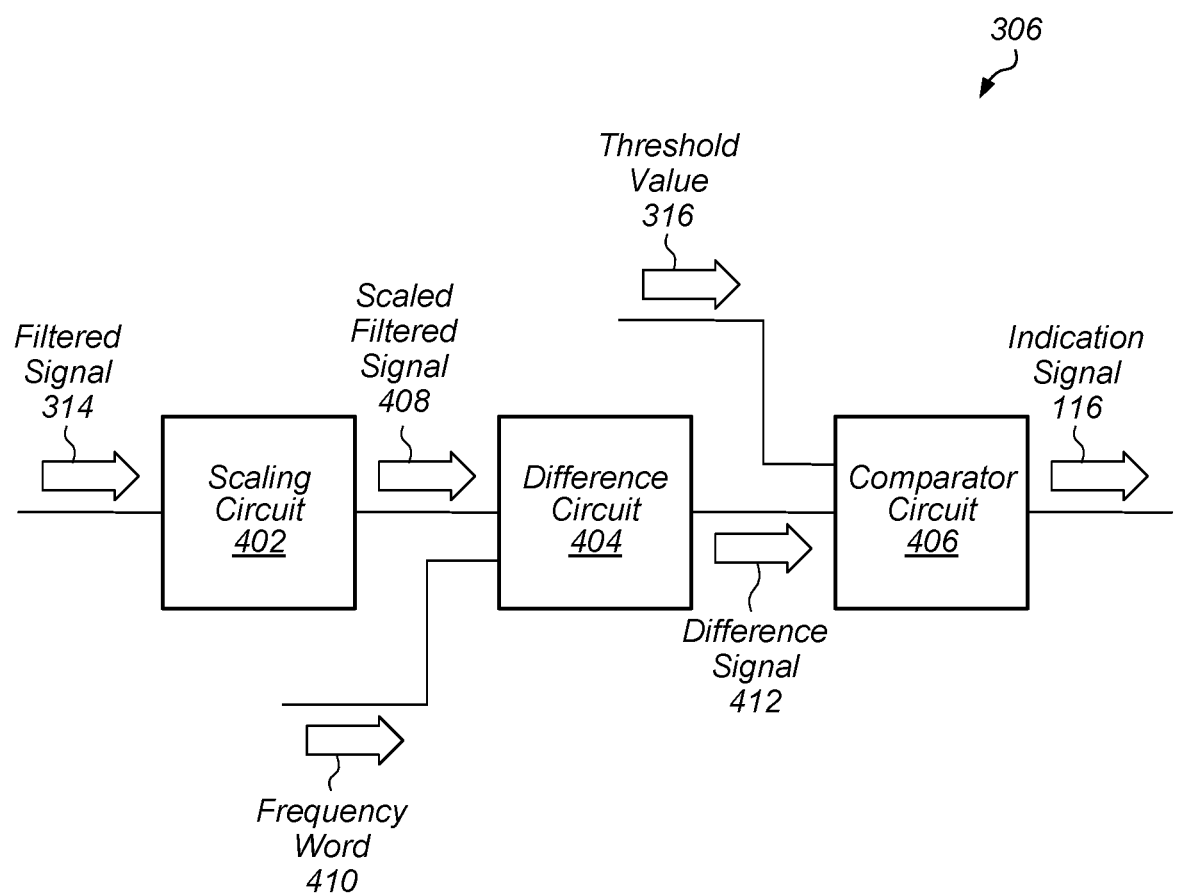
FIG. 4 is a block diagram of an embodiment of a comparison circuit.

A block diagram illustrating an embodiment of comparison circuit 306 is shown in FIG. 4. As illustrated, this embodiment of comparison circuit 306 includes scaling circuit 402, difference circuit 404, and comparator circuit 406.

Scaling circuit 402 is configured to scale filtered signal 314 appropriately for comparison to a frequency word 410, producing scaled filtered signal 408. In an embodiment, frequency word 410 is in the form of a ratio of a link rate, for the communication link or channel bringing input signals 108 into receiver circuit 100, to a known reference rate. Frequency word 410 may also include a scaling factor. In an embodiment, frequency word 410 can be thought of as representing an expected clock rate for the received data based on known characteristics of the transmitter and/or the communication link. Scaling circuit 402 scales filtered signal 314, which represents a ratio of the rate of clock signal 308 to that of reference clock signal 310, for comparison to frequency word 410. Factors accounted for by scaling circuit 402 may include, for example, one or more of: any difference between the reference rate used for frequency word 410 and the frequency of reference clock signal 310, any frequency division factor between clock signal 308 and feedback signal 222 used by phase detector circuit 204 of FIG. 2, whether filtered signal 314 results from counting cycles of clock signal 308 over one cycle or multiple cycles of reference clock signal 310, and any scaling factors included in determining frequency word 410.

Difference circuit 404 is configured to find a difference between scaled filtered signal 408 and frequency word 410. In an embodiment, difference circuit 404 subtracts frequency word 410 from scaled filtered signal 408. Difference circuit 404 includes a bitwise digital subtraction circuit in some embodiments. Difference signal 412 represents the difference between scaled filtered signal 408 and frequency word 410. Comparator circuit 406 is configured to compare difference signal 412 to threshold value 316. In an embodiment, comparator circuit 406 sets indication signal 116 to a logical high value if difference signal 412 exceeds threshold value 316. Comparator circuit 406 includes a digital magnitude comparator circuit in some embodiments.

In the embodiment of FIG. 4, threshold value 316 represents an amount by which the frequency of a clock signal generated by receiver 100 (as normalized to a reference clock frequency) and reflected in scaled filtered signal 408 can vary from the link rate of the channel (as normalized to a reference rate) reflected in frequency word 410. In an embodiment, threshold value 316 is set low enough that the frequency of the generated clock does not increase enough to cause circuit blocks using the generated clock to lose logical state, but high enough that the generated clock frequency is not adjusted as a result of small or temporary clock frequency shifts that are not sufficient to cause loss of logical state in the circuit blocks. Threshold value 316 may in some embodiments be set at a level that causes clock frequency adjustment of the generated clock in response to clock frequency runaway caused by interruption of the incoming data stream to a receiver, but not in response to other types of clock frequency shift. Determination of threshold value 316 may include considering timing requirements of circuit blocks configured to use the generated clock.

The comparison process illustrated in FIG. 4, in which a difference between numbers representing a normalized clock frequency and a normalized link rate is compared to a threshold, may advantageously allow adjustment of the clock frequency when the incoming data stream is interrupted without disruption of the clock generator circuit for smaller variations in clock frequency caused by other conditions or events. Use of normalized frequency values for the comparison process may also allow measurement circuit 106 to be used for incoming data streams having various frequency ranges corresponding to various communication interfaces or protocols. The measurement process illustrated in FIG. 3 may allow a rapid determination of whether the frequency of clock signal 308 has exceeded a threshold frequency corresponding to the frequency at which threshold value 316 is exceeded.

It is noted that the circuits of FIG. 3 and FIG. 4 are merely example implementations and other approaches may be used in other embodiments. For example, threshold value 316 may take the form of a frequency value or normalized frequency value in some embodiments using a comparison circuit 306 having a different configuration than that of FIG. 4. As another example, scaling circuit 402 may not be needed in some embodiments of comparison circuit 306 otherwise similar to that of FIG. 4, depending on values of filtered signal 314 and frequency word 410. For the circuits of FIG. 3 and FIG. 4 and all other circuits disclosed herein, functions of circuits depicted as separate could be combined in one circuit in some embodiments, or functions of circuits depicted as single circuits could be split between multiple circuits.

Figure 5A:
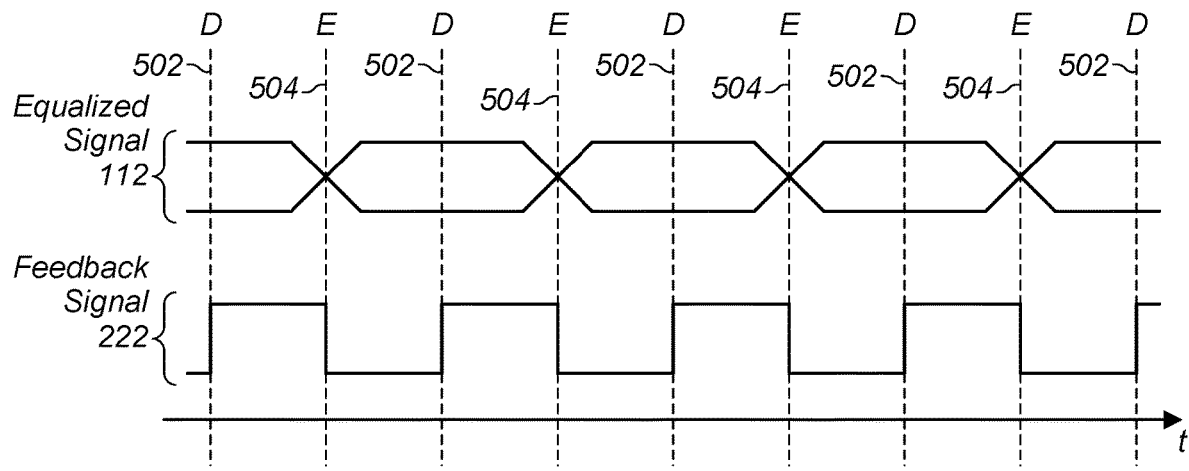
FIG. 5A is a diagram depicting example waveforms associated with operation of a clock generation circuit in the presence of an incoming data stream.
Figure 5B:
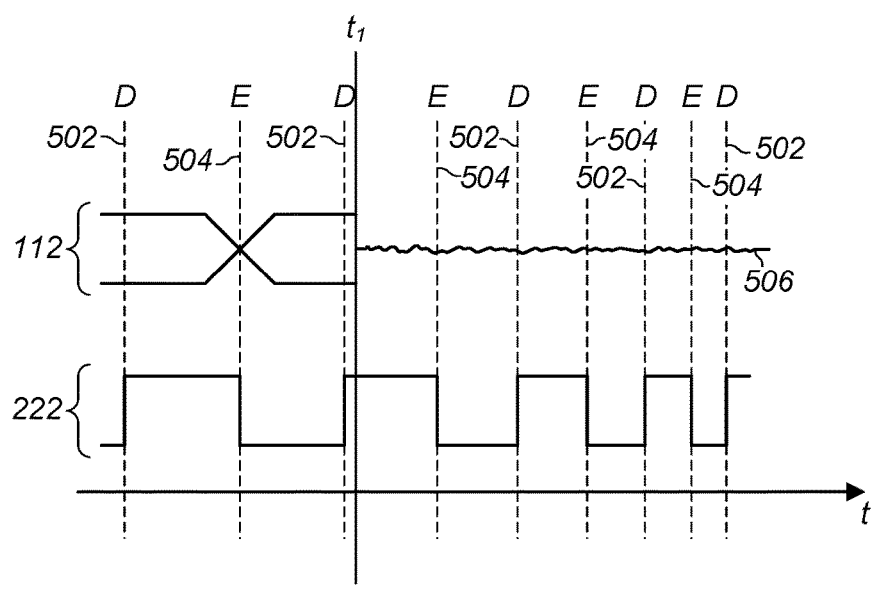
FIG. 5B is a diagram depicting example waveforms associated with operation of a clock generation circuit when an incoming data stream is interrupted.

Turning to FIG. 5A and FIG. 5B, example waveforms associated with operation of clock generator circuit 104 are shown. The waveforms of FIG. 5A illustrate examples of equalized signal 112 and feedback signal 222 as a function of time t when an incoming data stream is present and the PLL within clock generator circuit 104 has locked so that transitions of feedback signal 222 are aligned to transitions of equalized signal 112. In the embodiment of FIG. 5A, phase detector circuit 204 uses "data" ("D") samples 502 and "edge" ("E") samples 504 of equalized signal 112, taken at transitions of feedback signal 222, to determine whether transitions of signal 222 are "early" or "late" with respect to transitions of equalized signal 112.

The sampling approach shown in FIG. 5A corresponds to sampling by an Alexander phase detector. Using this approach, amplitudes of signal 112 in data samples 502 can be converted to logic levels and used to generate a recovered data signal. The amplitude of signal 112 in each edge sample 504 is compared to amplitudes of its immediately preceding and succeeding data samples. If the edge sample amplitude is the same as the that of the preceding data sample, the phase detector determines that the corresponding clock transition is early compared to the data transition. If the edge sample amplitude is the same as that of the succeeding data sample, the corresponding clock transition is determined to have occurred late compared to the data transition. With reference to clock generator circuit 104 of FIG. 2, these "early" or "late" determinations are reflected in error signal 216, and lead to frequency adjustment of VCO circuit 210 until feedback signal 222 and equalized signal 112 are phase-aligned. It is noted that different phase detectors with different sampling approaches may be used in other embodiments. In general, sampling of equalized signal 112 is used to generate a clock signal with transitions aligned to those of the incoming data.

FIG. 5B illustrates example waveforms associated with operation of clock generator circuit 104 when the incoming data stream is interrupted. In the example of FIG. 5B, the incoming data stream is interrupted at time $t_1$, for example by unplugging a USB connection. After time $t_1$, equalized signal 112 is in the form of a random noise signal 506. The lack of clear logical values associated with samples 502 and 504 taken after time $t_1$ causes the phase detector to generate error signals that change the clock frequency in an attempt to locate transitions in the noise signal. The clock signal frequency can then increase rapidly and reach a level beyond the operational limits of circuit blocks using the clock signal. The disclosed solution addresses this problem by detecting the frequency increase and adjusting the clock frequency before it reaches a level causing processing errors or loss of state.

To summarize, an apparatus is disclosed for limiting the frequency of a clock signal. In one embodiment, the apparatus includes a front-end circuit, a clock generator circuit and a measurement circuit. The front-end circuit is configured to generate an equalized signal including a plurality of signals that encode a serial data stream, where the serial data stream includes a plurality of symbols. The clock generator circuit is configured to generate a clock signal using a plurality of samples of the equalized signal. The measurement circuit is configured to monitor a frequency of the clock signal and generate an indication signal in response to a determination that the frequency of the clock signal exceeds a threshold frequency. The clock generator circuit is also configured to adjust the frequency of the clock signal using the indication signal.

An embodiment of the measurement circuit is configured to determine a number of cycles of the clock signal occurring during at least one cycle of a reference clock signal in order to monitor the frequency of the clock signal. The measurement circuit may also filter the number of cycles of the clock signal occurring during the at least one cycle of the reference clock signal to generate a filtered signal. In a further embodiment, the measurement circuit is configured to determine a difference between the filtered signal and a ratio of a data rate of the communication link and a reference data rate and perform a comparison between this difference and a threshold value.

An embodiment of the clock generator circuit includes an oscillator circuit configured to generate an oscillator signal using a control signal and is configured to reduce a frequency of the oscillator signal to generate the clock signal. In a further embodiment, the clock generator circuit is configured to set the control signal to a particular value that corresponds to a reference frequency to adjust the frequency of the clock signal in response to activation of the indication signal.

Turning to FIG. 6, a flow diagram depicting an embodiment of a method for operating a device including a receiver circuit is illustrated. The method may be applied to devices including various receiver circuits, such as receiver circuit 100 illustrated in FIG. 1.

Method 600 includes, in block 602, receiving at least one signal via a communication link, where the at least one signal encodes a serial data stream that includes a plurality of data symbols. Input signals 108 of FIG. 1 represent one example of at least one signal encoding a serial data stream. The method further includes sampling the at least one signal at multiple points in time to generate a plurality of samples (block 604). One example of such sampling is shown in FIG. 5A, where generation of a plurality of samples including data samples 502 and edge samples 504 is illustrated. In an embodiment, the sampling is done using a clock generator circuit such as clock generator circuit 104.

The method further includes, in block 606, generating a clock signal using the plurality of samples. In an embodiment, generating a clock signal includes using an oscillator circuit to generate an oscillator signal, and using the plurality of samples to align transitions in the oscillator signal to transitions in the at least one signal. Generating the clock signal may also include reducing a frequency of the oscillator signal. In an embodiment, generating the clock signal is done using a clock generator circuit such as clock generator circuit 104.

Method 600 further includes monitoring a frequency of the clock signal (block 608). In an embodiment, monitoring the frequency of the clock signal includes determining a number of cycles of the clock signal that occur during at least one cycle of a reference clock signal. Monitoring the frequency is done using a measurement circuit such as measurement circuit 106 in some embodiments.

The method further includes adjusting the frequency of the clock signal in response to determining that the frequency of the clock signal exceeds a threshold frequency (block 610). In an embodiment, adjusting the frequency of the clock signal includes setting an oscillator circuit to a reference frequency. Adjusting the frequency of the clock signal is done using a clock generator circuit such as clock generator circuit 104 in some embodiments.

In some embodiments in which monitoring the frequency of the clock signal includes determining a number of cycles of the clock signal occurring during at least one cycle of a reference clock signal, the method may also include filtering the number of cycles of the clock signal to generate a filtered signal. In various embodiments, the method may further include determining a difference between the filtered signal and a ratio of a data rate of the communication link and a reference data rate, and comparing the difference to a threshold value.

In various embodiments, a method for operating a device including a receiver circuit may also include processing, using the clock signal, data recovered using the plurality of samples. The processing may be performed by a circuit block receiving the clock signal and recovered data from a clock and data recovery (CDR) circuit. Such a CDR circuit may include a clock generator circuit such as clock generator circuit 104. The method may further include initiating a shutdown of processing circuitry used in processing the data recovered using the plurality of samples, in response to determining that the frequency of the clock signal exceeds the threshold frequency. Initiating a shutdown process when a clock frequency runaway is detected may allow for power savings in the absence of incoming data. Circuit blocks using recovered data may also be able to save information associated with the last-processed valid data and prevent corruption of such information.

Figure 7:
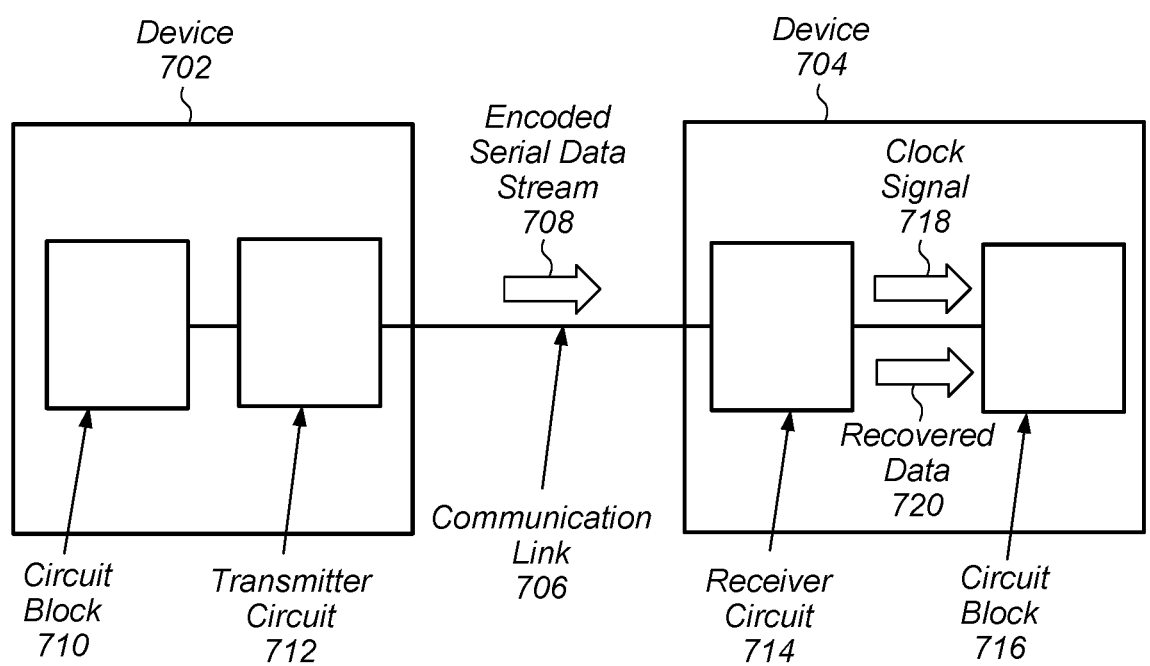
FIG. 7 a block diagram illustrating transmission of a serial data stream to a device including a receiver circuit.

A block diagram illustrating communication of a serial data stream between two devices is shown in FIG. 7. As illustrated, a transmitting device 702 sends an encoded serial data stream 708 to a receiving device 704 over a communication link 706. Link 706 may be a wired or wireless communication link or channel. Devices 702 and 704 are computer systems that may each take any of various forms, such as any of those described herein in connection with FIG. 9. Device 702 includes a circuit block 710 and transmitter circuit 712. In an embodiment, circuit block 710 includes memory circuits for storing data that can be encoded into encoded serial data stream 708 and transmitted using transmitter circuit 712. Circuit block 710 may include other types of circuits, and device 702 may include additional circuit blocks not shown, including a receiver circuit.

Receiving device 704 includes receiver circuit 714 and a circuit block 716. Receiver circuit 714 is similar to receiver circuit 100 described herein in connection with FIG. 1. In the embodiment of FIG. 7, receiver circuit 714 includes a CDR circuit and provides clock signal 718 and recovered data 720 to circuit block 716. In an embodiment, circuit block 712 includes data processing circuitry for processing recovered data 720 using clock signal 718. Such processing may include, for example, deserialization of data recovered from serial data stream 708. Circuit block 716 may include other types of circuits, and device 704 may include additional circuit blocks not shown, including a transmitter circuit. Clock signal 718 and recovered data 720 may be generated as described herein in connection with, for example, FIG. 2 and FIG. 5A.

Interruption of data stream 708, such as by unplugging from device 704 a USB connection carrying the data stream, can lead to a runaway increase in frequency of clock signal 718, as described elsewhere herein. This frequency increase can cause timing requirements of logical gates within circuit block 716 to be violated, causing logical errors and loss of state. The frequency limiter circuit and techniques described herein allow a frequency runaway of clock signal 718 to be detected, and the frequency of signal 718 to be adjusted in response. In an embodiment, the runaway is detected before errors and loss of logical state occur. This may allow an orderly shutdown procedure for circuit block 716 to be initiated when the flow of recovered data 720 is stopped.

Figure 8:
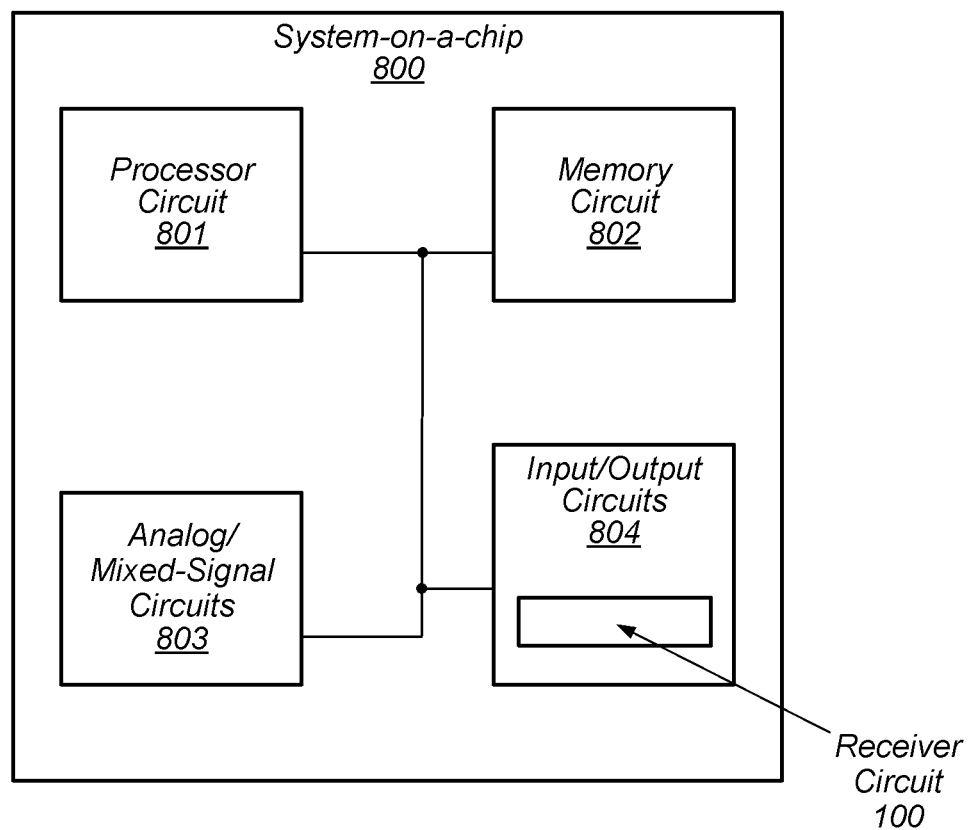
FIG. 8 is a block diagram of a system-on-a-chip including a receiver circuit.

A block diagram of a system-on-a-chip (SoC) is illustrated in FIG. 8. In the illustrated embodiment, the SoC 800 includes processor circuit 801, memory circuit 802, analog/mixed-signal circuits 803, and input/output circuits 804. Input/output circuits 804 include receiver circuit 100.

Processor circuit 801 may, in various embodiments, be representative of a general-purpose processor that performs computational operations. For example, processor circuit 801 may be a central processing unit (CPU) such as a microprocessor, a microcontroller, an application-specific integrated circuit (ASIC), or a field-programmable gate array (FPGA).

Memory circuit 802 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 8, in other embodiments, any suitable number of memory circuits may be employed.

Analog/mixed-signal circuits 803 may include a crystal oscillator circuit, a phase-locked loop circuit, an analog-to-digital converter (ADC) circuit, and a digital-to-analog converter (DAC) circuit (all not shown).

Input/output circuits 804 may be configured to coordinate data transfer between SoC 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol. As described elsewhere herein, receiver circuit 100 may be configured to receive a serial data stream using a protocol such as USB, generate a clock signal aligned to transitions in the data stream, and adjust the frequency of the clock signal if it exceeds a threshold frequency as a result of interruption of the data stream.

Input/output circuits 804 may also be configured to coordinate data transfer between SoC 800 and one or more devices (e.g., other computing systems or integrated circuits) coupled to SoC 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Figure 9:
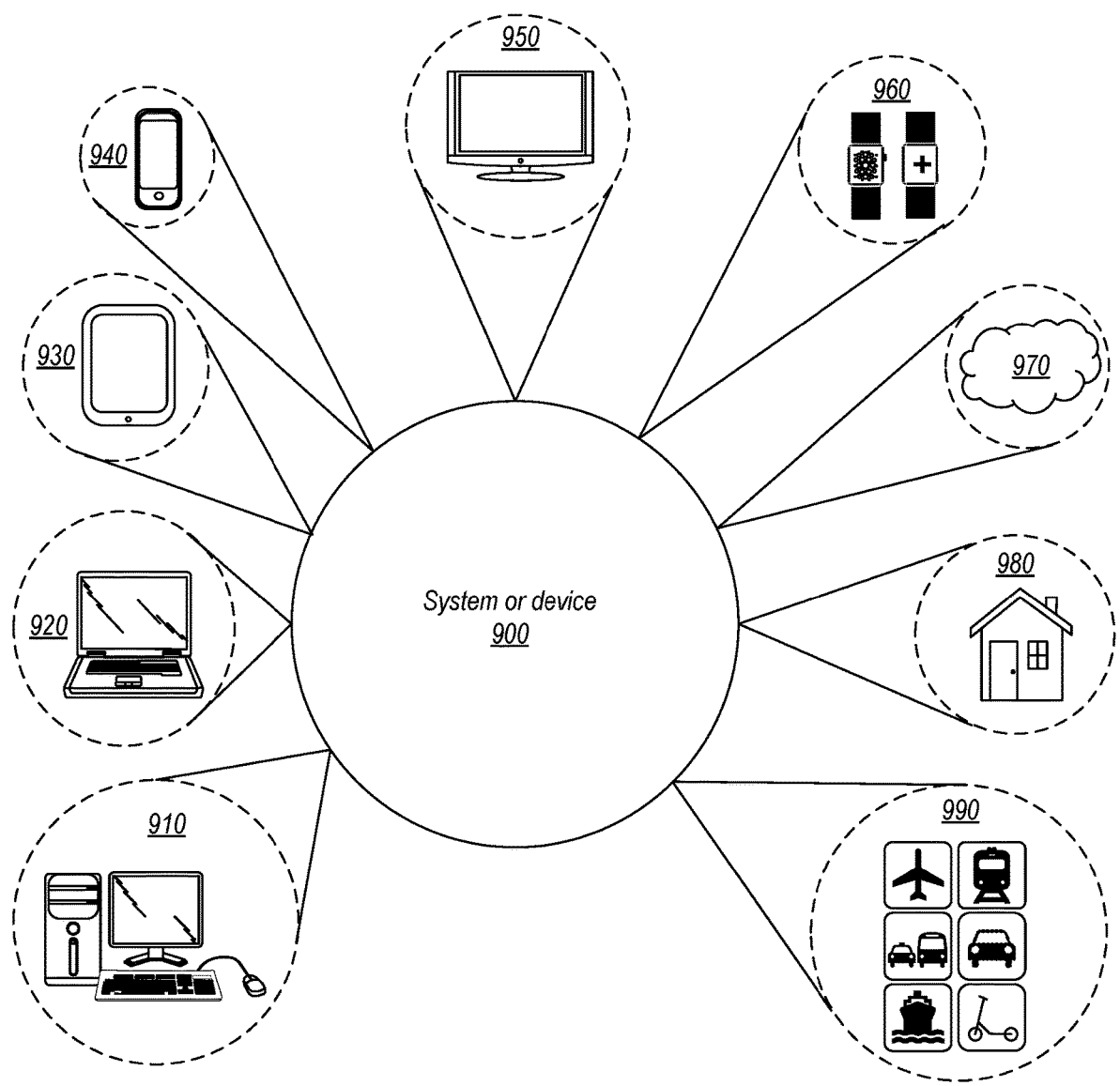
FIG. 9 is a block diagram of various embodiments of computer systems that may include receiver circuits.

Turning now to FIG. 9, various types of systems that may include any of the circuits, devices, or systems discussed above are illustrated. System or device 900, which may incorporate or otherwise utilize one or more of the techniques described herein, may be utilized in a wide range of areas. For example, system or device 900 may be utilized as part of the hardware of systems such as a desktop computer 910, laptop computer 920, tablet computer 930, cellular or mobile phone 940, or television 950 (or set-top box coupled to a television).

Similarly, disclosed elements may be utilized in a wearable device 960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 900 may also be used in various other contexts. For example, system or device 900 may be utilized in the context of a server computer system, such as a dedicated server or on shared hardware that implements a cloud-based service 970. Still further, system or device 900 may be implemented in a wide range of specialized everyday devices, including devices 980 commonly found in the home such as refrigerators, thermostats, security cameras, etc. The interconnection of such devices is often referred to as the "Internet of Things" (IoT). Elements may also be implemented in various modes of transportation. For example, system or device 900 could be employed in the control systems, guidance systems, entertainment systems, etc. of various types of vehicles 990.

The applications illustrated in FIG. 9 are merely exemplary and are not intended to limit the potential future applications of disclosed systems or devices. Other example applications include, without limitation: portable gaming devices, music players, data storage devices, unmanned aerial vehicles, etc.

Figure 10:
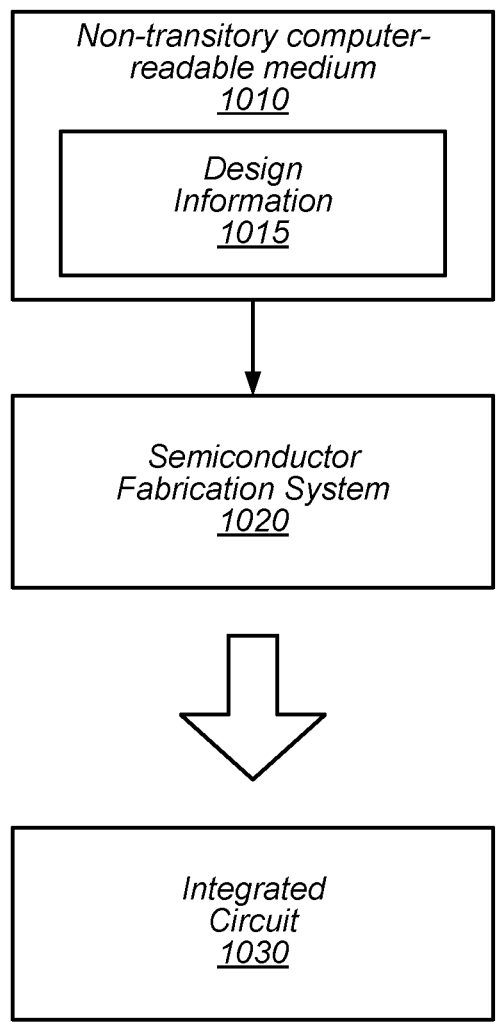
FIG. 10 illustrates an example of a non-transitory computer-readable storage medium that stores circuit design information.

FIG. 10 is a block diagram illustrating an example non-transitory computer-readable storage medium that stores circuit design information, according to some embodiments. In the illustrated embodiment, semiconductor fabrication system 1020 is configured to process the design information 1015 stored on non-transitory computer-readable storage medium 1010 and fabricate integrated circuit 1030 based on the design information 1015.

Non-transitory computer-readable storage medium 1010, may comprise any of various appropriate types of memory devices or storage devices. Non-transitory computer-readable storage medium 1010 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1010 may include other types of non-transitory memory as well or combinations thereof. Non-transitory computer-readable storage medium 1010 may include two or more memory mediums, which may reside in different locations, e.g., in different computer systems that are connected over a network.

Design information 1015 may be specified using any of various appropriate computer languages, including hardware description languages such as, without limitation: VHDL, Verilog, SystemC, SystemVerilog, RHDL, M, MyHDL, etc. Design information 1015 may be usable by semiconductor fabrication system 1020 to fabricate at least a portion of integrated circuit 1030. The format of design information 1015 may be recognized by at least one semiconductor fabrication system, such as semiconductor fabrication system 1020, for example. In some embodiments, design information 1015 may include a netlist that specifies elements of a cell library, as well as their connectivity. One or more cell libraries used during logic synthesis of circuits included in integrated circuit 1030 may also be included in design information 1015. Such cell libraries may include information indicative of device or transistor level netlists, mask design data, characterization data, and the like, of cells included in the cell library.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 is configured to operate according to a circuit design specified by design information 1015, which may include performing any of the functionality described herein. For example, integrated circuit 1030 may include any of various elements shown or described herein. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
    a front-end circuit configured to generate an equalized signal using a plurality of signals that encode a serial data stream that includes a plurality of data symbols;
    a clock generator circuit configured to generate a clock signal using a plurality of samples of the equalized signal; and
    a measurement circuit configured to:
        generate a filtered signal reflecting a number of cycles of the clock signal that occur during at least one cycle of a reference clock signal;
        determine a difference between the filtered signal and a frequency word based on a reference data rate; and
        in response to a determination that the difference exceeds a threshold value, activate an indication signal; and
    wherein the clock generator circuit is further configured, in response to activation of the indication signal, to set a frequency of the clock signal to a particular frequency.

2. The apparatus of claim 1, wherein the clock generator circuit includes an oscillator circuit configured to generate an oscillator signal using a control signal, and wherein to set the frequency of the clock signal to the particular frequency, the clock generator circuit is further configured to set, in response to the activation of the indication signal, the control signal to a particular value that corresponds to the particular frequency.

3. A method, comprising:
    receiving at least one signal via a communication link, wherein the at least one signal encodes a serial data stream that includes a plurality of data symbols;
    sampling the at least one signal at multiple points in time to generate a plurality of samples;
    generating a clock signal using the plurality of samples;
    generating a filtered signal reflecting a number of cycles of the clock signal that occur during at least one cycle of a reference clock signal;
    determining a difference between the filtered signal and a frequency word based on a reference data rate; and
    in response to determining that the difference exceeds a threshold value, setting a frequency of the clock signal to a particular frequency.

4. The method of claim 3, wherein setting the frequency of the clock signal to the particular frequency includes setting an oscillator circuit to the particular frequency.

5. The method of claim 3, further comprising processing, using the clock signal, data recovered using the plurality of samples.

6. The method of claim 5, further comprising, in response to determining that the difference exceeds the threshold value, initiating a shutdown of processing circuitry used in processing the data recovered using the plurality of samples.

7. An apparatus, comprising:
    a receiver circuit coupled to a communication link, wherein the receiver circuit is configured to:
        receive at least one signal that encodes a serial data stream that includes a plurality of data symbols;
        sample the at least one signal at multiple points in time to generate a plurality of samples;
        generate a clock signal using the plurality of samples;
        generate a plurality of recovered data symbols using the clock signal and the plurality of samples;
        generate a filtered signal reflecting a number of cycles of the clock signal that occur during at least one cycle of a reference clock signal;
        determine a difference between the filtered signal and a frequency word based on a reference data rate; and
        in response to a determination that the difference exceeds a threshold value, set a frequency of the clock signal to a particular frequency; and
    a circuit block configured to perform one or more processing operations using the clock signal and the plurality of recovered data symbols.

8. The apparatus of claim 7, wherein the receiver circuit includes an oscillator circuit configured to generate an oscillator signal using a control signal, and wherein to generate the clock signal, the receiver circuit is further configured to reduce a frequency of the oscillator signal.

9. The apparatus of claim 8, wherein to set the clock signal to the particular frequency, the receiver circuit is further configured to set the control signal to a particular value that corresponds to the particular frequency.

10. The apparatus of claim 7, wherein the receiver circuit includes a phase-locked loop circuit that includes a feedback loop, and wherein to set the frequency of the clock signal to the particular frequency, the receiver circuit is further configured to disable the feedback loop of the phase-locked loop circuit.

11. The apparatus of claim 1, wherein the threshold value is set at a level that causes response to a frequency runaway condition caused by interruption of the serial data stream.

12. The apparatus of claim 1, wherein the frequency word is further related to a link rate of a channel carrying the serial data stream.

13. The apparatus of claim 1, wherein:
the clock generator circuit includes an oscillator circuit; and
the clock generator circuit is configured, in response to the activation of the indication signal, to provide a reference clock signal rather than an output of the oscillator circuit as the clock signal.

14. The apparatus of claim 1, wherein:
the measurement circuit is further configured to scale the filtered signal to generate a scaled filtered signal; and
determining the difference includes determining a difference between the frequency word and the scaled filtered signal.

15. The method of claim 3, wherein the frequency word is further related to a link rate of the communication link.

16. The method of claim 3, wherein setting the frequency of the clock signal to the particular frequency includes providing a reference clock rather than an output of an oscillator circuit as the clock signal.

17. The method of claim 3, further comprising scaling the filtered signal to generated a scaled filtered signal, and wherein determining the difference includes determining a difference between the scaled filtered signal and the frequency word.

18. The apparatus of claim 7, wherein the frequency word is further related to a link rate of the communication link.

19. The apparatus of claim 7, wherein:
the receiver circuit includes an oscillator circuit; and
to set the clock signal to the particular frequency, the receiver circuit is further configured to provide a reference clock signal rather than an output of the oscillator circuit as the clock signal.

20. The apparatus of claim 7, wherein the receiver circuit is further configured, in response to the determination, to initiate a shutdown of the circuit block.

\* \* \* \* \*